(12) United States Patent
Ko (10) Patent No.: US 7,736,156 B2
(45) Date of Patent: Jun. 15, 2010

(54) CONNECTOR ASSEMBLY WITH IMPROVED SOLDER TAILS

(75) Inventor: David (Tso-Chin) Ko, Fullerton, CA (US)

(73) Assignee: Apple Inc., Cupertino, CA (US)

( * ) Notice: Subject to any disclaimer, the term of this patent is extended or adjusted under 35 U.S.C. 154(b) by 4 days.

(21) Appl. No.: 11/801,610

(22) Filed: May 10, 2007

(65) Prior Publication Data

US 2008/0280495 A1 Nov. 13, 2008

(51) Int. Cl.
*H01R 13/58* (2006.01)
(52) U.S. Cl. .................................. 439/76.1; 439/83
(58) Field of Classification Search .................. 439/83, 439/76.1, 78, 489, 452, 459, 460, 466, 891, 439/700
See application file for complete search history.

(56) References Cited

U.S. PATENT DOCUMENTS 2,595,188 A * 4/1952 Del Camp .................. 439/58
6,165,006 A * 12/2000 Yeh et al. .................. 439/490
6,447,343 B1 * 9/2002 Zhang et al. ............... 439/700
6,663,415 B1 * 12/2003 Wu .......................... 439/460
6,773,312 B2    8/2004 Bauer et al.
6,814,626 B2   11/2004 Wen-Yao
6,846,188 B2 *  1/2005 Hsin et al. ................. 439/79

FOREIGN PATENT DOCUMENTS

TW       M260910      4/2005
TW       M266589      6/2005

* cited by examiner

*Primary Examiner*—Felix O Figueroa
(74) *Attorney, Agent, or Firm*—Townsend and Townsend and Crew LLP (57) ABSTRACT

A connector assembly (100) adapted for electrically connecting with a complementary connector along a mating direction includes an insulative housing (2) defining a mating port, a number of contacts (3) disposed in the housing, a circuit board (4) located on a rear side of the housing and including a front surface facing to the rear side of the housing and an opposite rear surface, and a number of solder tails (8) located behind the rear surface of the circuit board and electrically connecting the contacts with the printed circuit board.

17 Claims, 9 Drawing Sheets

CONNECTOR ASSEMBLY WITH IMPROVED SOLDER TAILS

BACKGROUND OF THE INVENTION

1. Field of the Invention

The present invention generally relates to a connector assembly, and more particularly to a connector assembly used for power transmission.

2. Description of Related Art

POGO-type (spring-type or pressure) contacts are widely used for chargeable batteries. Such contact as disclosed in U.S. Pat. No. 6,773,312, usually comprises a pin assembled with a spring, a sleeve receiving the pin and the spring, and a mounting portion exposed outside the sleeve for electrically connecting with a printed circuit board. With development of technology, different structures of such type contact are designed to meet different requirements. U.S. Pat. No. 6,814,626 discloses a compression contact having a U-shape mounting portion having tabs pressing against the spring and a bottom portion for surface-mounting to a printed circuit board (PCB) perpendicular to the extending direction of the contact. However, using such type of mounting portion increases the length or dimension along mating direction of the connector which is not glad to be seen by customers or users under today's compact design trend. Thus, it is desired to design a new type POGO (spring-type or pressure) contact to address the problems mentioned above.

BRIEF SUMMARY OF THE INVENTION

Accordingly, an object of the present invention is to provide a connector assembly with improved solder tails for achieving more reliable connection between contacts and a printed circuit board.

In order to achieve the above-mentioned object, a connector assembly in accordance with the present invention comprises an insulative housing defining a mating port, a plurality of contacts disposed in the housing, a circuit board located on a rear side of the housing and comprising a front surface facing to the rear side of the housing and an opposite rear surface, a plurality of solder tails located behind the rear surface of the circuit board and electrically connecting the contacts with the printed circuit board.

Other objects, advantages and novel features of the invention will become more apparent from the following detailed description of the present embodiment when taken in conjunction with the accompanying drawings.

DETAILED DESCRIPTION OF THE INVENTION

Reference will now be made to the drawing figures to describe the present invention in detail.

Figure 1:
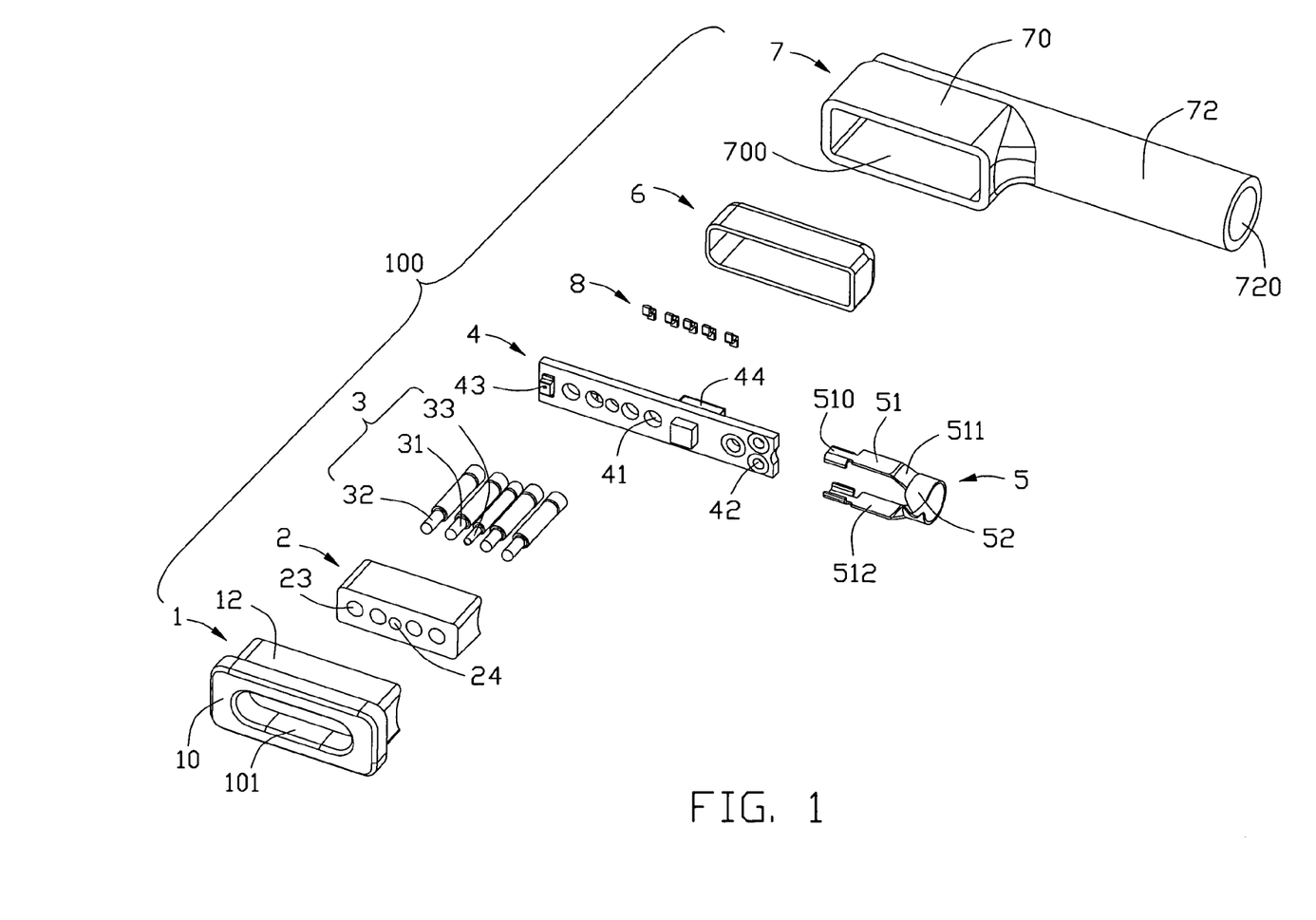
FIG. 1 is an exploded, perspective view of a connector assembly in accordance with the first embodiment of the present invention.
Figure 2:
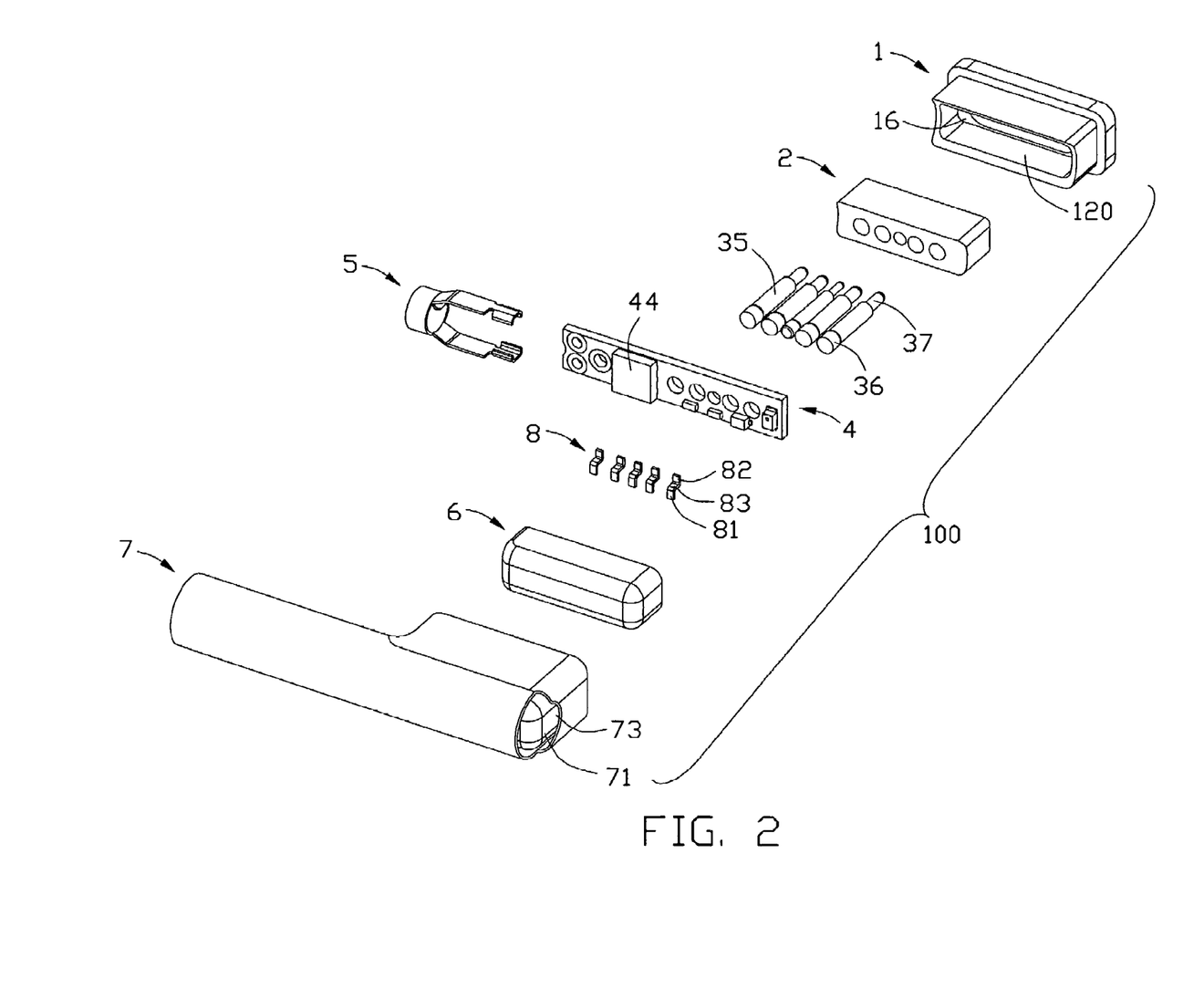
FIG. 2 is a view similar to FIG. 1, but viewed from a different aspect.
Figure 3:
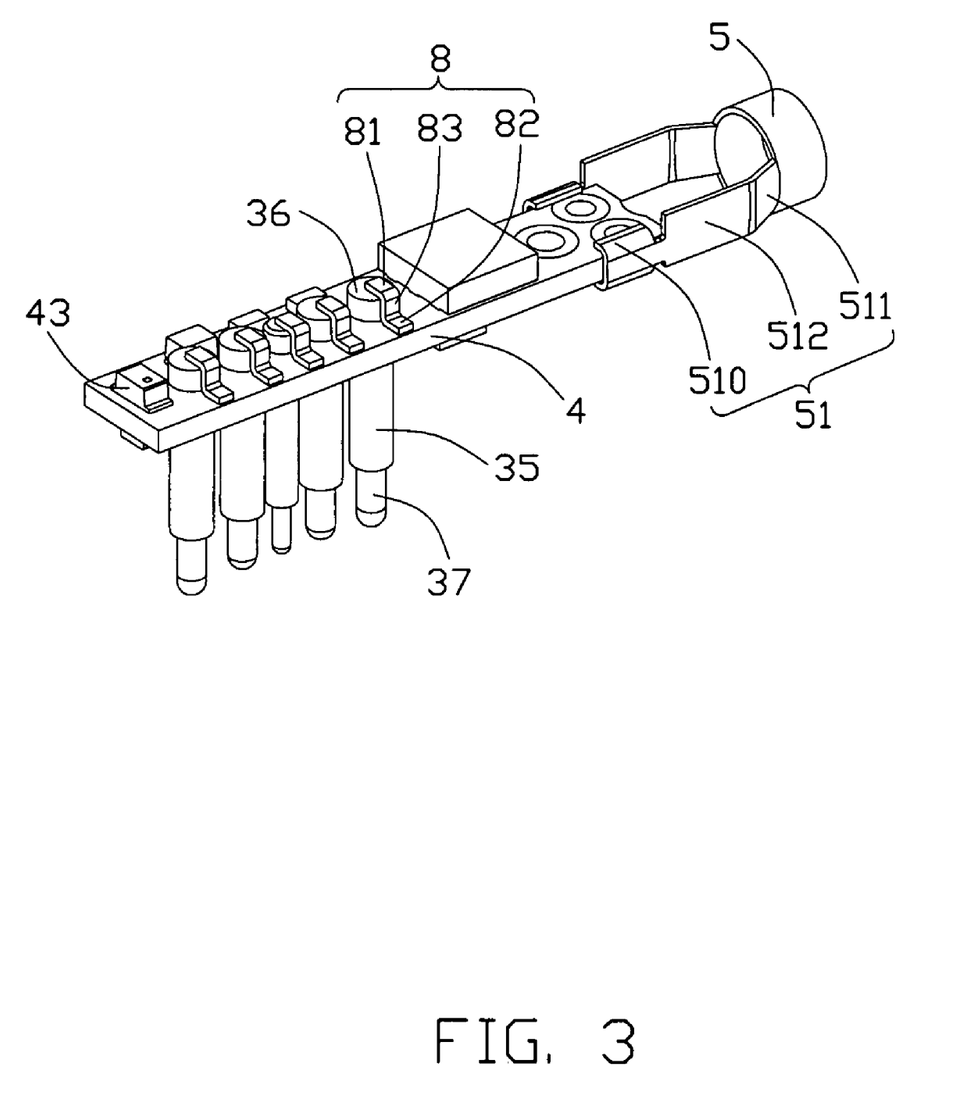
FIGS. 3-6 are partially assembled views of the connector assembly of the connector assembly in accordance with the first embodiment.

Referring to FIGS. 1-3, a connector assembly 100 in accordance with the first embodiment of the present invention comprises an insulative housing 2, a plurality of conductive contacts 3 assembled to the housing 2, a circuit board 4 assembled to the housing 2, a plurality of conductive elements 8 respectively electrically connecting with the contacts 3 and the circuit board 4, a strain relief member 5 assembled to and electrically connecting with the circuit board 4, a cable (not shown) electrically connecting with the strain relief member 5 and the circuit board 4 to achieve the electrical connection with the conductive contacts 3, front and rear covers 1, 7 respectively assembled to the housing 2 and together enclosing the elements mentioned above therebetween.

Now turning to FIGS. 1-2, the housing 2 is made from insulative material. The housing 2 defines two pairs of large-size first receiving passages 23 and a center small-size second receiving passage 24 respectively recessed from a front face thereof to a rear face thereof. Particularly, the right side surface is curved for forming a whole toothbrush design of the connector assembly 100.

Now referring to FIGS. 1-2, the conductive contacts 3 consist of a pair of ground contacts 32, a pair of power contacts 31 located between the pair of ground contacts 32 and a center detect contact 33 located between the pair of power contacts 31. Each contact 3 is of a POGO Pin type (spring-type pin pressure pin), that is to say, there is a spring (not shown) inside the contact 3, thus, when mating, front contacting portion 37 of the contact 3 can be pressed to rearward move along the mating direction. Each ground contact 32 comprises the column-shape contacting portion 37 with a relatively small diameter and capable of being compressed, a column-shape media portion 35 with a relatively large diameter, and an end portion 36 formed at rear end of the media portion 35 with a column-shape and larger diameter. The power contact 31 has the same structure as that of the ground contact 32 except the contacting portion 37 thereof has a length shorter than that of the ground contact 32. Thus, the ground contacts 32 will firstly mate with a complementary connector and lastly disengage from the complementary connector for assuring safe power and signal transmission. The detect contact 33 has the same structure as that of the power contact 31 except each portion thereof has a smaller diameter than that of the power contact 31.

Figure 4:
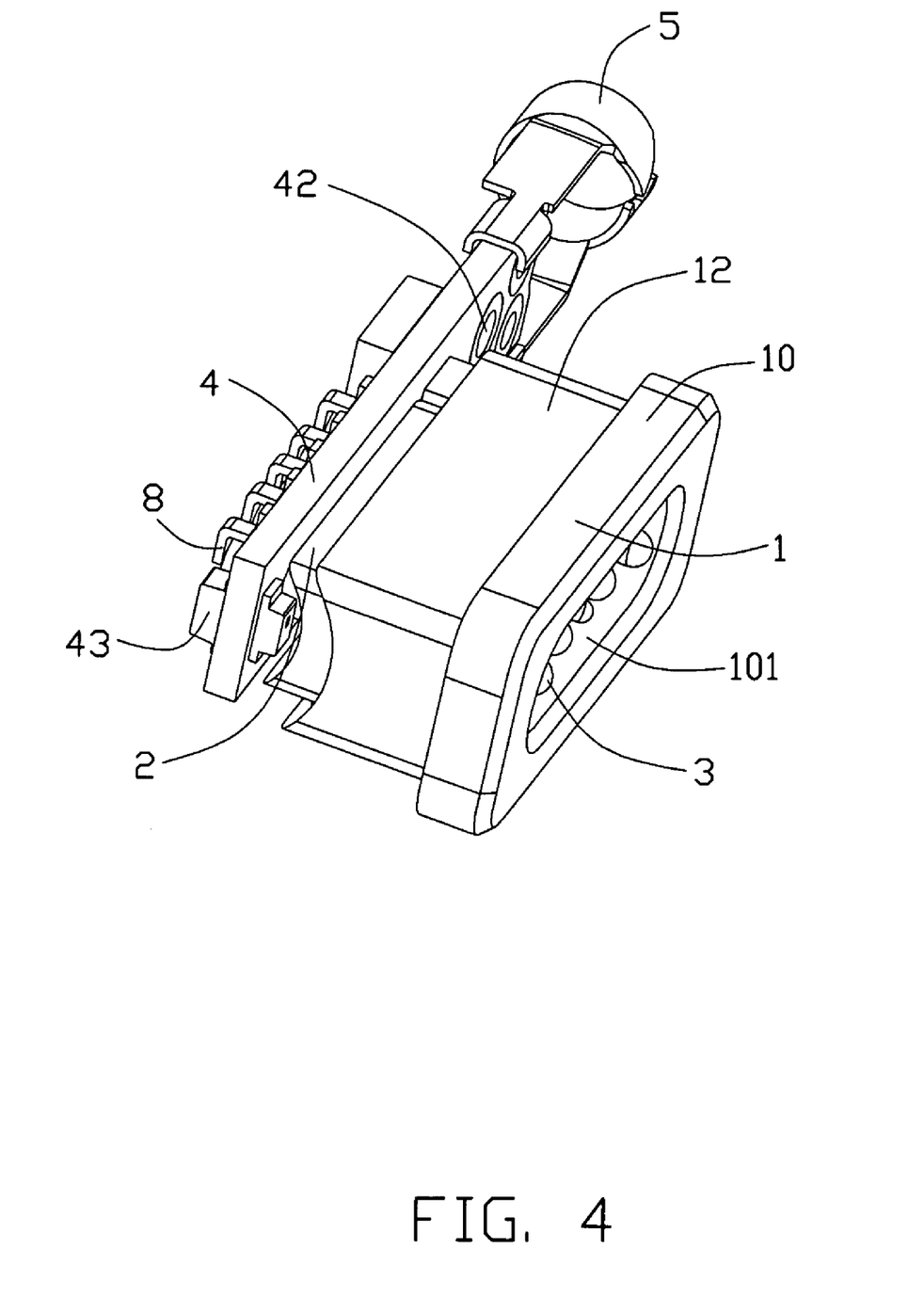
Figure 5:
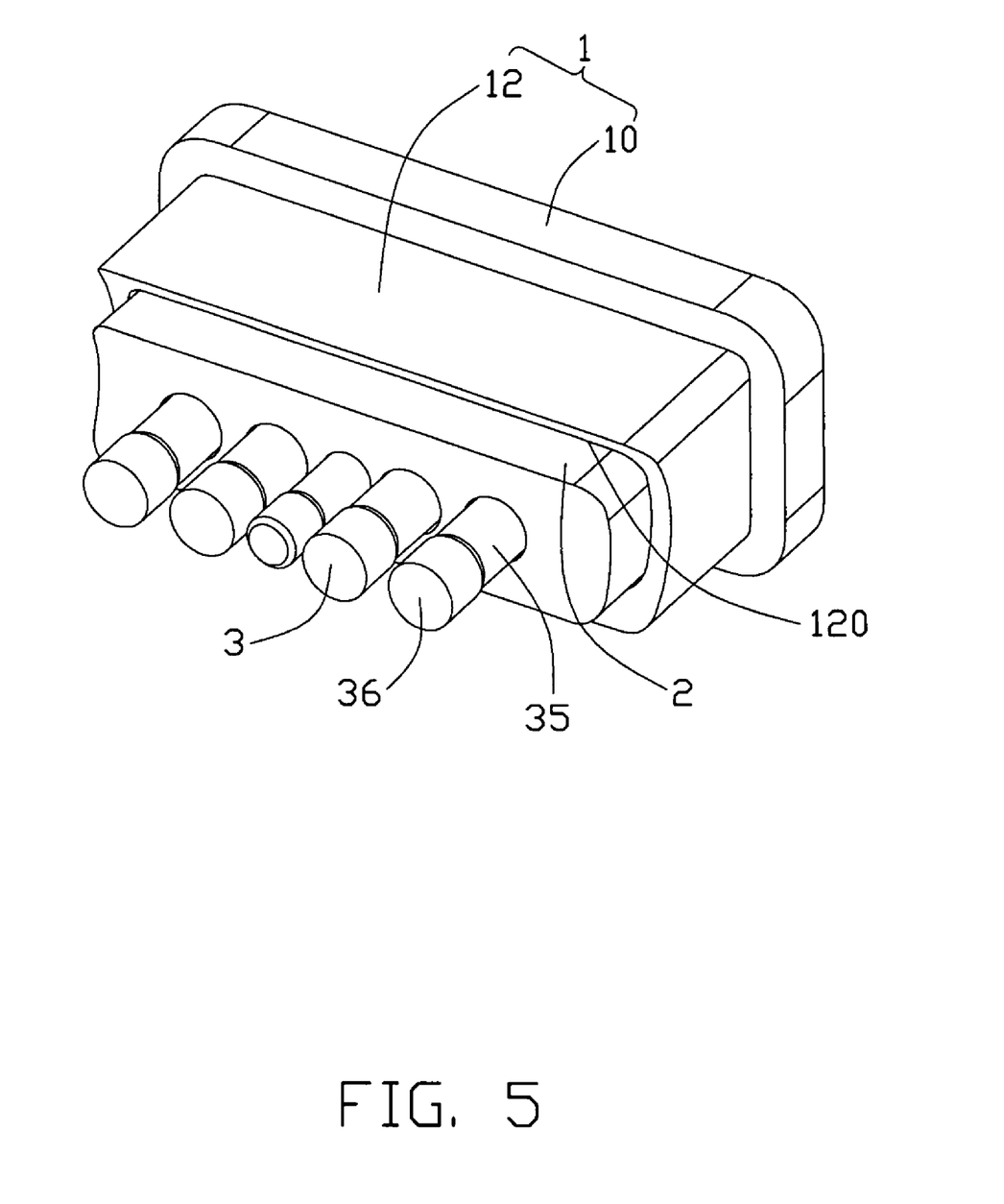
Figure 6:
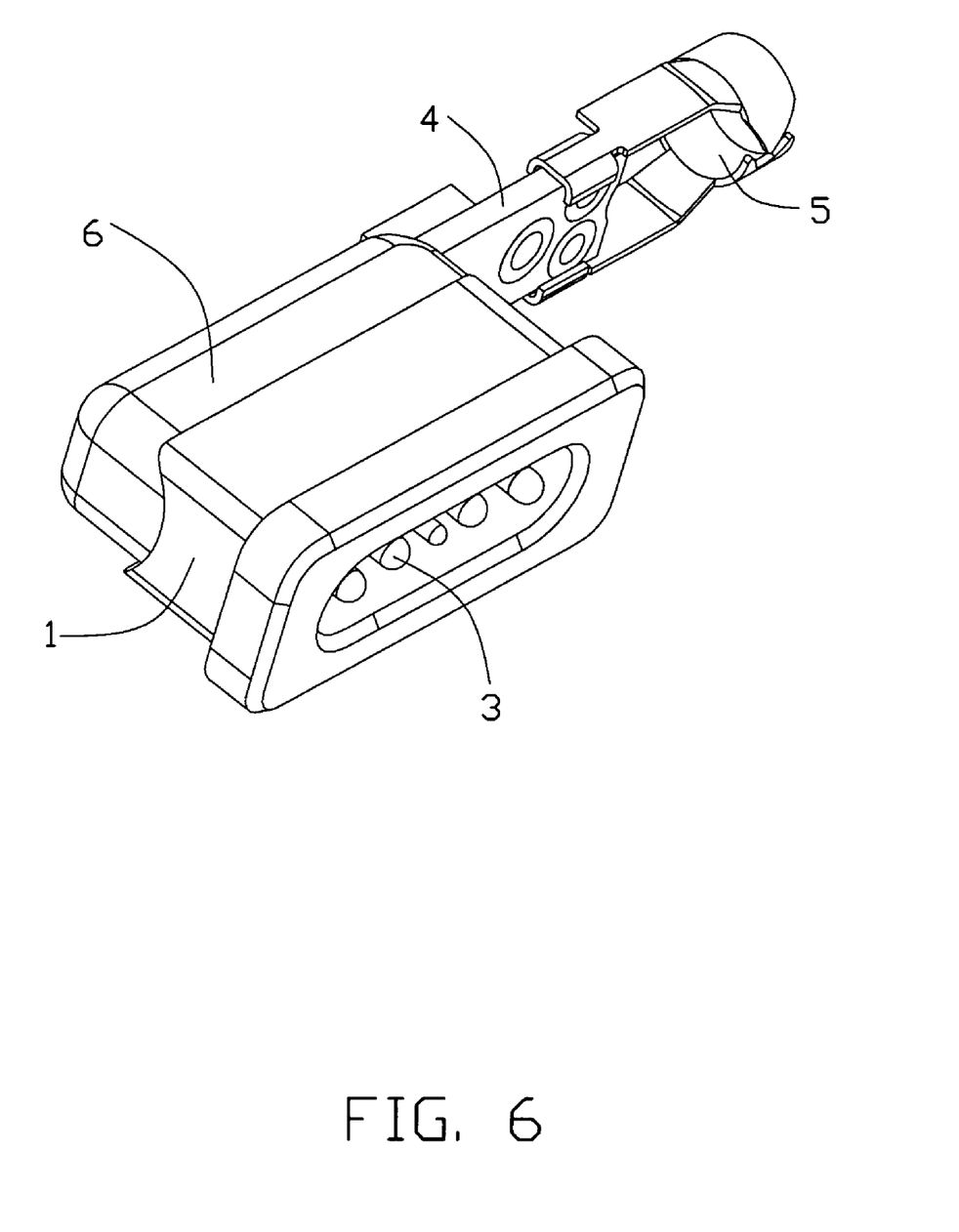

Referring to FIGS. 1-2 and 4, the conductive elements 8, or the solder tails, consist of five pieces and each is Z-shape. Each conductive element 8 comprises a first connecting section 81, a second connecting section 82 parallel to the first connecting section 81, and a horizontal media section 83 interconnecting the first and second connecting sections 81, 82.

Referring to FIGS. 1-2, the circuit board 4 is mainly located in a vertical plane and has a certain thickness along a front-to-back direction, that is, the mating direction. The circuit board 4 comprises a substrate 40 having a front surface and an opposite rear surface, also having a left end and a right end. A plurality of passageways 41 penetrating from the front surface to the rear surface of the substrate 40 with diameters corresponding the those of the media portions 35 of the contacts 3. The passageways 41 are arranged in one line along transverse direction perpendicular to the mating direction. A plurality of through holes 42 are defined in the substrate 40 and around the right end of the substrate 40. Each through hole 42 is plated with conductive material for electrically soldering with conductors of the cable (not shown). A pair of LEDs (Light Emitting Diode) is formed on the front surface and the rear surface and located adjacent to the left end of the substrate 40. The circuit board 4 may be equipped with an IC 44 for driving the LEDs 43 to emit light.

The strain relief member 5 is stamped from metal material or other conductive material. The strain relief member 5 comprises a strain relief section 52 for grasping with metal braiding layer of the cable (not shown) and a pair of arms 51 extending horizontally from upper and lower locations of the strain relief section 52 and parallel to each other. Each arm 51 located in the horizontal plane and comprises an inclined section 511 connecting with the strain relief section 52, a flat section 512, and a tail section 510 formed at free end of the flat section 512. The tail section 510 is of U-shape and comprises a pair of side sections bending from the flat section to form the U-shape for electrically connecting with the circuit board 4.

The cable comprises a plurality of wires each comprising an inner conductor, a metal braiding layer surrounding the inner conductor, and an outer jacket enclosing the metal braiding layer. A front portion of the outer jacket is stripped to expose part of the inner conductor and the metal braiding layer.

The front and rear covers 1, 7 are respectively assembled to the housing 2. The front cover 1 is made from conductive material and capable of being attracted by the complementary connector. The front cover 1 comprises a body portion 12 and a front rectangular flange 10 with certain thickness and formed with front edge of the body portion 12. The flange 10 defines an elliptical-shape front receiving cavity 101 recessed rearwardly from a front surface thereof for receiving complementary connector. The body portion 12 defines a rectangular rear receiving passage 120 recessed forwardly from a rear surface thereof to communicate with the front receiving cavity 101 for receiving the housing 2. The receiving passage 120 has a large size along a lateral direction of the front cover 1 than that of the receiving cavity 101, thus, forming a step surface 16.

The rear cover 7 is made from resin material and of toothbrush shape. The rear cover 7 comprises a substantially rectangular main body 70 and a pipe-shape existing portion 72 extending vertically from the main body 70. The main body 70 defines a receiving space 700 recessed rearwardly from front surface thereof, while, the existing portion 72 defines a circular existing channel 720 communicating with the receiving space 700 for existing the cable therefrom. Particularly, the rear cover 7 defines a window area 73 with irregular shape. A light pipe 71 is firstly molded and shaped corresponding to the configuration of the left end of the circuit board 4 and the pair of LEDs 43, then the rear cover 7 is molded over the light pipe 71 to expose the light pipe 71 in the window area 73. Thus, the rear cover 7 and the light pipe 71 are formed as a unitary one. The light emitted from the pair of LEDs 43 spreads from the inner mold 6 to the light pipe 71, and finally can be seen from outside.

The inner mold 6 is made from transparent or semitransparent material and the light emitted from the LEDs 43 is capable of being spread out through the inner mold 6 to outside.

Referring to FIGS. 3-8 in conjunction with FIGS. 1-2, in assembly, the conductive contacts 3 firstly pass through the passageways 41 of the circuit board 4 from rear-to-front direction until the end portions 36 abutting against the rear surface of the circuit board 4. Each Z-shape solder tail 8 is respectively soldered with corresponding contact 3 and trace formed on the rear surface of the circuit board 4. The first and second connecting sections 81, 82 are respectively soldered to the end portion 36 and the trace of the circuit board 4, while, the media section 83 attaches to side surface of the end portion 36. The contacts 3 then are assembled to the insulative housing 2 with the media portions 35 interferentially received in the first and second receiving passages 23, 24 of the housing 2, while, the contacting portions 37 exposed beyond the front surface of the insulative housing 2. The housing 2 with the contacts 3 and the circuit board 4 is assembled to the front cover 1 with the housing 2 received in the receiving passage 120 of the body portion 12 and the contacting portions 37 of the contacts 3 are exposed in the receiving cavity 101.

Then the inner mold 6 is molded to the connection area between the contacts 3 and the circuit board 4, the solder tails 8, and rear portion of the insulative housing 2. Since the material of the inner mold 6 is transparent or semitransparent, the light emitted from the LEDs 43 of the circuit board 4 can be spread out from the left corner of the inner mold 6. The conductors of the cable (not shown) are soldered to the through holes 42 of the circuit board 4 to form electrical connection with the circuit board 4, further with the contacts 3. The strain relief member 5 is assembled to the circuit board 4 and the cable. The pair of U-shape tail sections 510 are respectively soldered to traces arranged on front and rear surface of the circuit board 4 adjacent to the through holes 42 of the circuit board 4. The front end of the cable is sandwiched between the pair of arms 51 and compressed by the inclined sections 511 and grasped by the strain relief section 52. Particularly, the front end of the cable is partially stripped to expose the inner metal braiding layer which is grasped by the strain relief section 52 of the strain relief member 5 to form electrical connection with the circuit board 4.

Figure 7:
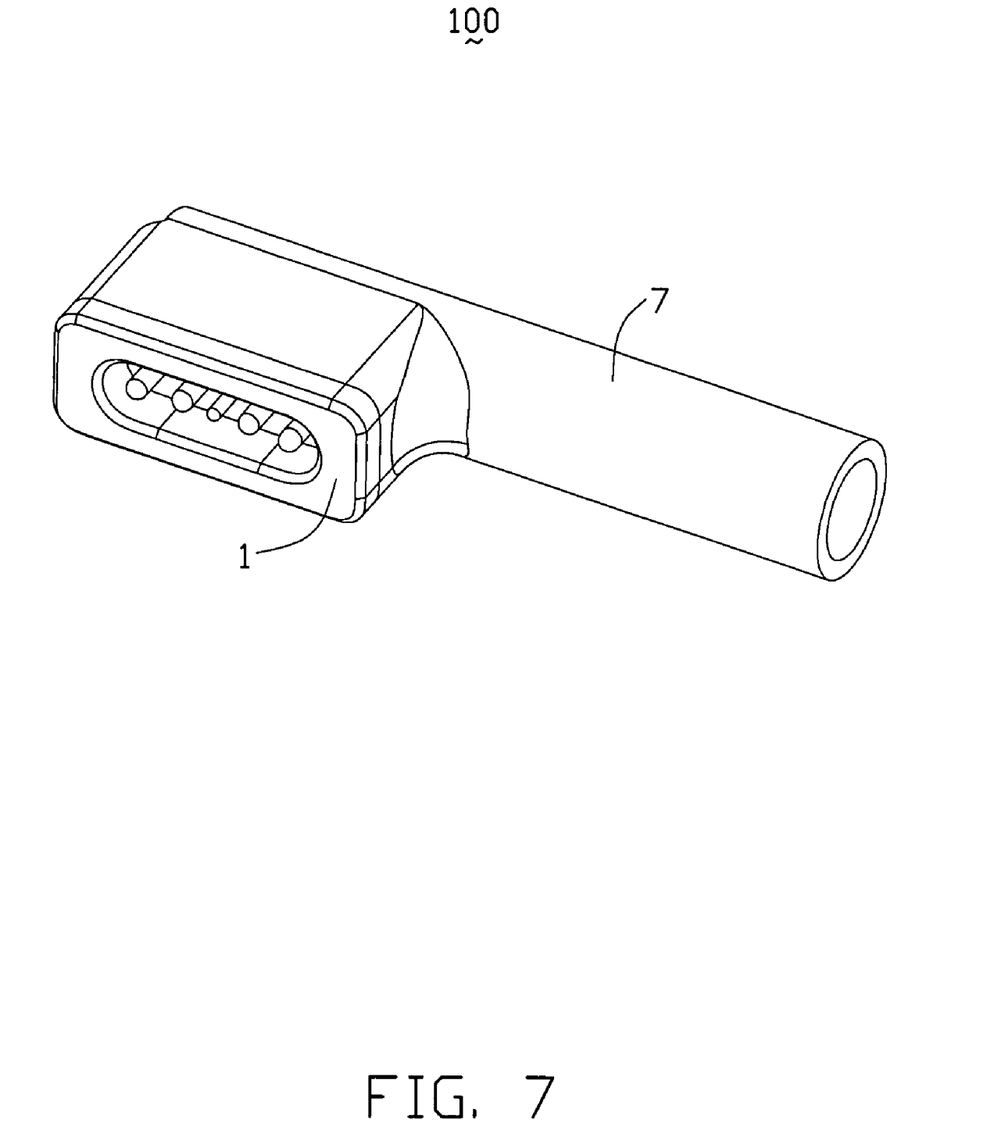
FIGS. 7-8 are assembled, perspective views of the connector assembly in accordance with the first embodiment of the present invention, but viewed from different aspects.
Figure 8:
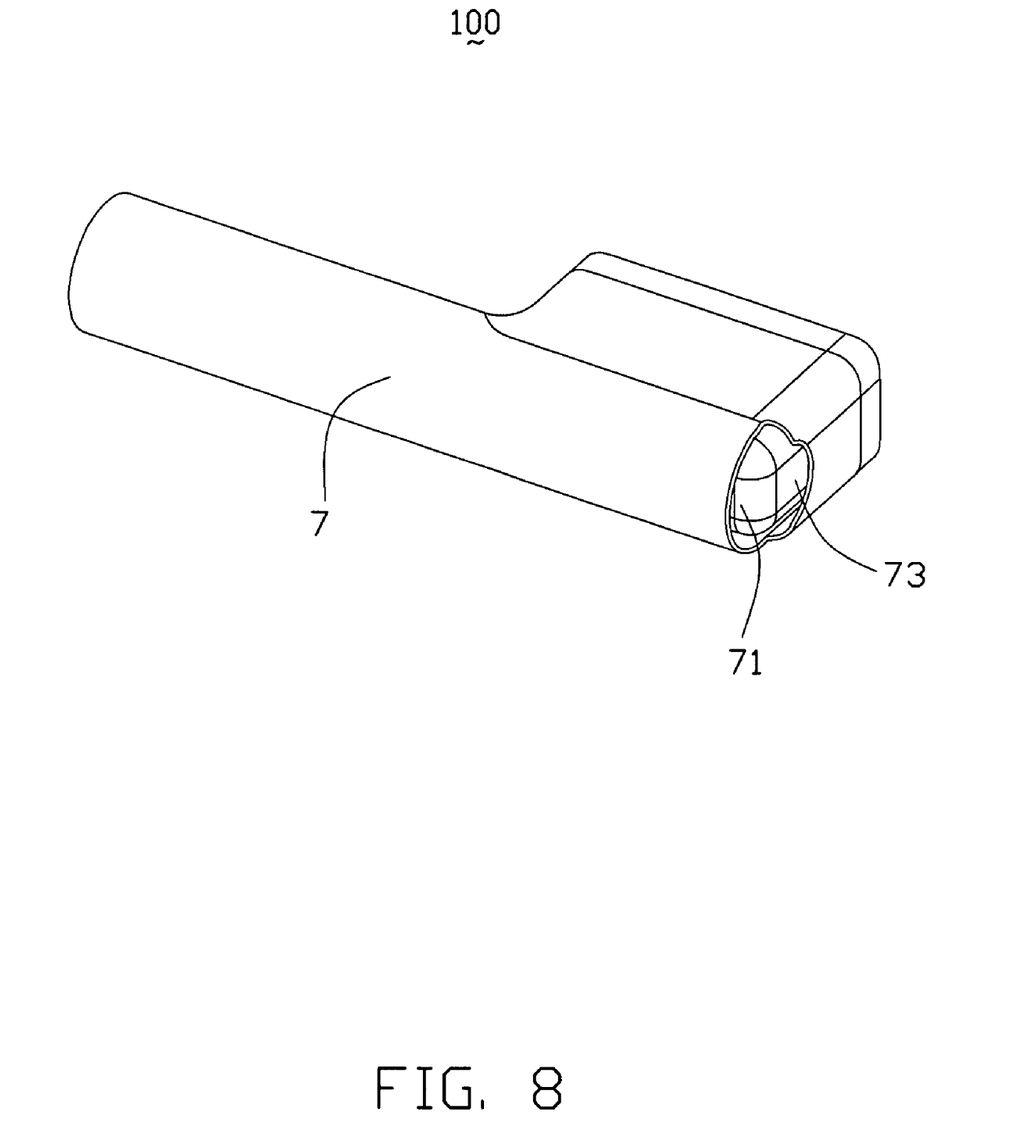

Finally, the rear cover 7 and the light pipe 71 are assembled to the assembly achieved above to enclose the all elements except for the flange 10 of the front cover 1. Thus, the toothbrush configuration of the connector assembly 100 is achieved. After the assembly, the front portion of the cable is received in the pipe-shape existing portion 72 of the rear cover 7 and other portion exists from the rear end of the existing portion 72.

Figure 9:
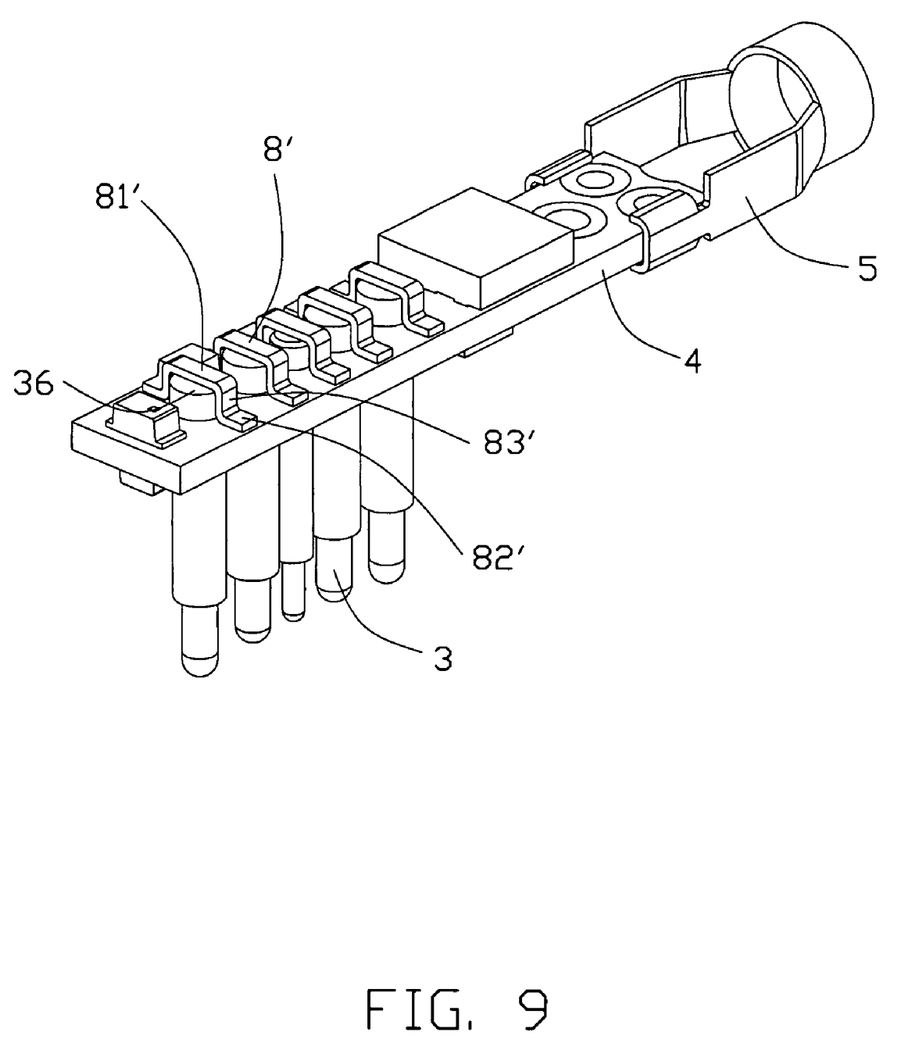
FIG. 9 is a partially assembled view of the connector assembly in accordance with the second embodiment of the present invention.

Now referring to FIG. 9, a second embodiment of the solder tails 8' is shown. The solder tail 8' is of Ω-shape and comprises a pair of second connecting sections 82' soldered with the traces of the circuit board 4, the first connecting section 81' soldered with the end portions 36 of the contacts 3, and a pair of media sections 83' respectively connecting the opposite ends of the second connecting section 82' with the pair of first connecting sections 81'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A connector assembly adapted for electrically connecting with a complementary connector along a mating direction, comprising:

an insulative housing defining a mating port;

a plurality of contacts disposed in the housing;

a circuit board located on a rear side of the housing and comprising a front surface facing to the rear side of the housing and an opposite rear surface;

a plurality of solder tails located behind the rear surface of the circuit board and electrically connecting the contacts with the printed circuit board;

front and rear covers assembled to the housing, wherein the material of the front cover is different from that of the rear cover; and an inner mold molding with the connection area between the contacts and the circuit board and the solder tails, and wherein the inner mold is made from transparent material or semitransparent material, wherein the solder tail is of Ω-shape and connects with a trace formed on the rear surface of the circuit board and the contact.

2. The connector assembly as claimed in claim 1, wherein the circuit board defines a plurality of passageways penetrating from the front surface to the rear surface, and wherein each contact comprises an end portion exposed beyond the rear surface of the circuit board.

3. The connector assembly as claimed in claim 2, wherein each solder tail comprises a first connecting section soldered with the end portion of the contact and a second connecting section soldered with the trace formed on the rear surface of the circuit board.

4. The connector assembly as claimed in claim 1, wherein the rear cover is of L-shaped.

5. The connector assembly as claimed in claim 1, further comprising a cable and a strain relief member, and wherein the cable comprises a conductor electrically connecting with the circuit board, a metal braiding layer electrically connecting with the strain relief member, and an outer jacket.

6. The connector assembly as claimed in claim 5, wherein the strain relief member comprises a strain relief section electrically connecting with the metal braiding layer of the cable and a pair of arms sandwiching the circuit board therebetween along a direction perpendicular to a mating direction of the connector assembly.

7. The connector assembly as claimed in claim 1, wherein the circuit board comprises at least one LED to spread light through the inner mold.

8. The connector assembly as claimed in claim 1, further comprising a rear cover assembled to enclose the inner mold, the housing and cable, and wherein the rear cover defines a window area to expose the inner mold to let the light emitted from the LED spread outwardly.

9. The connector assembly as claimed in claim 8, further comprising a light pipe filling up the window area to cover the area exposed in the window area of the inner mold.

10. A connector assembly adapted for electrically connecting with a complementary connector, comprising:
an insulative housing defining a mating port;
a plurality of contacts received in the insulative housing;
a circuit board having a front surface facing to a rear side of the insulative housing and a rear surface opposite to the front surface;
a plurality of solder tails located behind the rear surface of the circuit board, and each solder tail including a first connecting section and a second connecting section, said first connecting section disposed further away the rear surface relative to the second connecting section being arranged; and the first connecting sections of the solder tails soldered with corresponding contacts and the second connecting sections of the solder tails soldered to traces formed on the circuit board without contacting with the insulative housing;

the solder tail and the corresponding contact separable from each other, rather than being formed as a unitary body, before being soldered together, wherein the solder tail includes at least a Z-shaped structure thereof and connects with a trace formed on the rear surface of the circuit board and the contact.

11. The connector assembly as claimed in the claim 10, wherein the first and second connecting portions of the solder tail interconnected together via a media section.

12. The connector assembly as claimed in the claim 11, wherein the media section is substantially perpendicular to the printed circuit board.

13. A connector assembly comprising:
an insulative housing defining a plurality of passageways therein and a mating port in a front portion thereof;
a plurality of axially compressible columnar contacts disposed in the housing with columnar front contacting sections extending into the mating port and columnar rear end sections coaxially aligned with the corresponding columnar front contacting sections, respectively;
a printed circuit board located behind the housing and defining a plurality of through holes extending through opposite front and rear surfaces thereof; and
a plurality of conductive retaining tabs being discrete from the corresponding contacts and located about the corresponding through holes and electrically fastened on the rear surface,
wherein the columnar rear end sections extend through the corresponding through holes, respectively, and abut against the corresponding conductive retaining tabs axially,
wherein said printed circuit board defines a cable connection area for connection to a cable.

14. The connector assembly as claimed in claim 13, wherein said cable connection area is located on a lengthwise end of the printed circuit board so as to allow the cable connected thereto and extending along a lengthwise direction of the printed circuit board.

15. The connector assembly as claimed in claim 13, further comprising a cable and a strain relief member, and wherein the cable comprises a conductor electrically connecting with the circuit board, a metal braiding layer electrically connecting with the strain relief member, and an outer jacket; wherein the strain relief member comprises a strain relief section electrically connecting with the metal braiding layer of the cable and a pair of arms sandwiching the circuit board therebetween along a direction perpendicular to a mating direction of the connector assembly.

16. The connector assembly as claimed in claim 13, wherein the solder tail includes at least a Z-shaped structure thereof and connects with a trace formed on the rear surface of the circuit board and the contact.

17. The connector assembly as claimed in claim 13, wherein the columnar rear end sections extend beyond the corresponding through holes.

* * * * *

UNITED STATES PATENT AND TRADEMARK OFFICE
CERTIFICATE OF CORRECTION

PATENT NO. : 7,736,156 B2
APPLICATION NO. : 11/801610
DATED : June 15, 2010
INVENTOR(S) : David Ko

Page 1 of 1

It is certified that error appears in the above-identified patent and that said Letters Patent is hereby corrected as shown below:

In column 5, line 59, in Claim 10, after "further away", insert -- from --.

In column 6, line 17, in Claim 12, before "circuit" delete "printed".

Signed and Sealed this
Twenty-fifth Day of October, 2011

David J. Kappos
*Director of the United States Patent and Trademark Office*